United States Patent
Choi et al.

(10) Patent No.: US 12,135,227 B2
(45) Date of Patent: Nov. 5, 2024

(54) MULTI-MEASUREMENT DEVICE USING SEARCH COIL TYPE SENSOR

(71) Applicants: Jae Hun Choi, Seoul (KR); Tae Kyun Kim, Guri-si (KR)

(72) Inventors: Jae Hun Choi, Seoul (KR); Tae Kyun Kim, Guri-si (KR); Dong Hyung Kim, Seoul (KR)

(73) Assignees: Jae Hun Choi, Seoul (KR); Tae Kyun Kim, Guri-si (KR)

( * ) Notice: Subject to any disclaimer, the term of this patent is extended or adjusted under 35 U.S.C. 154(b) by 197 days.

(21) Appl. No.: 17/915,040

(22) PCT Filed: Apr. 5, 2021

(86) PCT No.: PCT/KR2021/004222
§ 371 (c)(1),
(2) Date: Sep. 27, 2022

(87) PCT Pub. No.: WO2021/210831
PCT Pub. Date: Oct. 21, 2021

(65) Prior Publication Data
US 2023/0168111 A1     Jun. 1, 2023

(30) Foreign Application Priority Data
Apr. 14, 2020   (KR) .................. 10-2020-0045116

(51) Int. Cl.
    *G01D 5/20*      (2006.01)
(52) U.S. Cl.
    CPC ..................... *G01D 5/20* (2013.01)

(58) Field of Classification Search
CPC ........ G01D 5/20; G01D 5/2013; G01D 5/204; H03K 2217/95; H03K 17/952; G05D 1/0259; G05D 3/125
See application file for complete search history.

(56) References Cited

U.S. PATENT DOCUMENTS

| | | | | |
|---|---|---|---|---|
| 6,469,500 | B1 * | 10/2002 | Schmitz | B60G 17/01933 251/129.16 |
| 2004/0046550 | A1 * | 3/2004 | Kondo | G01N 27/82 324/234 |

(Continued)

FOREIGN PATENT DOCUMENTS

| | | |
|---|---|---|
| JP | H046489 A | 1/1992 |
| KR | 20-0314113 Y1 | 5/2003 |

(Continued)

*Primary Examiner* — Akm Zakaria
(74) *Attorney, Agent, or Firm* — Bridgeway IP Law Group, PLLC; Jihun Kim

(57) ABSTRACT

A multi-measurement apparatus using a search-coil type sensor includes: sensor modules, each of which has one or more sensors including respective housings having respective inner spaces, respective cores formed to be inserted into the inner spaces of the housings, and respective coils which are each wound around a portion of an outer circumferential surface of each of the housings, the portion corresponding to a position of each of the cores; impedance matching units that are connected to a plurality of the sensors, respectively, and perform impedance matching; and amplifiers that are connected to the impedance matching units, respectively, and amplify a fine current and voltage generated during approach of objects to the sensors.

7 Claims, 12 Drawing Sheets

(56) References Cited

U.S. PATENT DOCUMENTS

| | | | | |
|---|---|---|---|---|
| 2007/0194781 A1* | 8/2007 | Zhitomirskiy | ......... | G01D 5/204 |
| | | | | 324/207.17 |
| 2008/0139883 A1* | 6/2008 | Uchiyama | .............. | A61B 1/041 |
| | | | | 600/117 |
| 2008/0258739 A1* | 10/2008 | Niwa | ................... | G01D 5/2013 |
| | | | | 324/654 |
| 2015/0035519 A1* | 2/2015 | Buelau | ................. | G01D 5/2291 |
| | | | | 324/207.18 |

FOREIGN PATENT DOCUMENTS

| | | | |
|---|---|---|---|
| KR | 10-0867375 | B1 | 11/2008 |
| KR | 100925259 | B1 | 11/2009 |
| KR | 10-1486193 | B1 | 1/2015 |
| KR | 10-2204171 | B1 | 1/2021 |

\* cited by examiner

MULTI-MEASUREMENT DEVICE USING SEARCH COIL TYPE SENSOR

TECHNICAL FIELD

The present invention relates to a multi-measurement apparatus using a search-coil type sensor, and more specifically, to a technology that enables measurement of a location or the like of a plurality of objects to be performed on the objects containing iron and that causes respective movement paths or the like of the plurality of objects to be determined.

BACKGROUND ART

Various technologies of SQUID, Fiber-Optic, Flux-Gate, Magnetic Impedance, or the like are applied to magnetic sensors, and the magnetic sensors are highly advanced to be applied to respective industrial fields which demand such technologies. In particular, as the Fourth Industrial Revolution era arrives, various IoT products are launched, and thus an application range of the magnetic sensor technology is expanded to an area of everyday life.

Accordingly, Samsung Electro-Mechanics in Korea, Honeywell International Inc. as a multinational conglomerate corporation, and the like have each developed a magnetic sensor in a more compact chip shape and have invested in a variety of research and development for improving a sensing sensitivity or range and reducing a sensing error.

Korean Patent Registration No. 10-0867375 (Title of the Invention: Apparatus and Method for Measuring Information of Location and Direction of Moving Object Using Three Magnetic Field Sensors) discloses a method including an installation step of installing two magnetic field sensors corresponding to a surface formed by x and y axes, respectively, to a moving object and installing a magnetic field sensor corresponding to a z axis to the moving object, a storing step of measuring the earth's magnetic field corresponding to x, y, and z axes and storing information values of a reference magnetic field in an internal memory in the moving object, a determining step of causing the moving object to measure magnitudes of a magnetic field on x, y, and z axes while the moving object moves and then determining whether or not an absolute value of a difference between a measured Z-axis magnetic field value and a Z-axis reference magnetic field value is smaller than an error range set in a magnetic field sensor, and an updating step of updating a direction information value of the moving object by using measured x- and y-axes magnetic field values, when determination in the determining step is that the absolute value of the difference between the measured Z-axis magnetic field value and the reference value is smaller than the error range of the sensor.

CITATION LIST

[Patent Literature] Korean Patent Registration No. 10-0867375

SUMMARY OF INVENTION

Technical Problem

An object of the present invention is to enable a location, displacement, or the like of an object to be detected using a fine magnetic field of the object containing iron without causing any change to a core and a coil which do not have any magnetic component.

In addition, another object of the present invention is to inhibit a detection delay due to a range (non-polarity range) in which a magnetic field subsides temporarily during a change in pole with respect to a sensor due to displacement of an object containing iron.

Further, still another object of the present invention is to enable measurement or the like of locations of a plurality of objects to be performed and respective movement paths or the like of the plurality of objects to be determined.

Technical objects to be achieved by the present invention are not limited to the technical objects mentioned above, and the following description enables other unmentioned technical objects to be clearly understood by a person of ordinary skill in the art to which the present invention pertains.

Solution to Problem

The present invention to achieve the above-described objects has a configuration including: sensor modules, each of which has one or more sensors including respective housings having respective inner spaces, respective cores formed to be inserted into the inner spaces of the housings, and respective coils which are each wound around a portion of an outer circumferential surface of each of the housings, the portion corresponding to a position of each of the cores; impedance matching units that are connected to a plurality of the sensor modules, respectively, and perform impedance matching; and amplifiers that are connected to the impedance matching units, respectively, and amplify a fine current and voltage generated during approach of objects to the sensor modules. The sensor modules have respective induced magnetic fields formed due to a change in distance from the objects containing iron (Fe) and measure movement of one or more of the objects.

In an embodiment of the present invention, the plurality of sensor modules may be formed, and the impedance matching units and the amplifiers may be connected to the each of the plurality of sensor modules, respectively.

In the embodiment of the present invention, the multi-measurement apparatus using a search-coil type sensor may further include: a first control unit that is connected to the plurality of amplifiers and analyzes a waveform of the amplified current and voltage; and a second control unit that is connected to the first control unit and analyzes the movement of the objects.

In the embodiment of the present invention, the second control unit may discriminate between the objects having respective magnetic flux densities within a predetermined magnetic flux density range.

In the embodiment of the present invention, the multi-measurement apparatus using a search-coil type sensor may further include an output unit that is connected to the second control unit and visually outputs locational changes of the objects.

In the embodiment of the present invention, a plurality of the sensors may be arranged in parallel or radially with each other.

In the embodiment of the present invention, the plurality of coils provided in the sensors may be arranged in series with each other.

In the embodiment of the present invention, one end of a coil provided in one sensor may be connected to one end of a coil provided in another sensor, and the other end of the coil provided in the one sensor may be connected to the other end of the coil provided in the other sensor.

Advantageous Effects of Invention

According to the above-described configuration, the present invention is effective in that a fine change in magnetic field and flux quantity of an object containing iron can be detected such that a position, displacement, or the like of the object containing iron can be detected with ultra-low electric power.

In addition, the present invention is effective in that, even when a range (non-polarity range) in which a magnetic field subsides temporarily is formed during a change in pole with respect to a sensor due to displacement of an object containing iron, a magnetic field of the object containing iron can be detected by another adjacent sensor or coil such that the apparatus can be normally and continuously operated.

In addition, the present invention is effective in that detection and measurement can be performed regardless of arrangement or the like of sensors or sensor modules.

In addition, the present invention is effective in that measurement or the like of locations of a plurality of objects can be performed using a plurality of sensor modules, and thereby respective movement paths or the like of the plurality of objects can be determined.

Further, the present invention is effective in that, since a fine change in magnetic field and flux quantity of an object containing iron can be detected, the apparatus can exhibit the same performance regardless of an effect of air, soil, water, or the like.

The effects of the present invention are construed not to be limited to the above-described effects but to include every effect that can be derived from the configurations of the present invention described in detailed description or claims of the present invention.

DESCRIPTION OF EMBODIMENTS

The preferred embodiment according to the present invention includes: sensor modules, each of which has one or more sensors including respective housings having respective inner spaces, respective cores formed to be inserted into the inner spaces of the housings, and respective coils which are each wound around a portion of an outer circumferential surface of each of the housings, the portion corresponding to a position of each of the cores; impedance matching units that are connected to a plurality of the sensor modules, respectively, and perform impedance matching; and amplifiers that are connected to the impedance matching units, respectively, and amplify a fine current and voltage generated during approach of objects to the sensor modules. The sensor modules have respective induced magnetic fields formed due to a change in distance from the objects containing iron (Fe) and measure movement of one or more of the objects.

EMBODIMENTS

Hereinafter, the present invention will be described with reference to the accompanying drawings. However, the present invention can be realized as various different examples and, thus, is not limited to embodiments described here. Further, a part irrelevant to the description is omitted from the drawings in order to clearly describe the present invention, and similar reference signs are assigned to similar parts through the entire specification.

In the entire specification, a case where a certain part "is connected to (accesses, is in contact with, or is coupled to)" another part means not only a case where the parts are "directly connected" to each other, but also a case where the parts are "indirectly connected" to each other with another member interposed therebetween. In addition, when a certain part "comprises" a certain configurational element, this doesn't mean that another configurational element is excluded, but the certain configurational element can be further included unless specifically described otherwise.

Terms used in this specification are only used to describe a specific embodiment and are not intentionally used to limit the present invention. A word having a singular form also includes a meaning of its plural form unless obviously implied otherwise in context. In this specification, a term such as "to comprise" or "to have" is construed to specify that a feature, a number, a step, an operation, a configurational element, a part, or combinations thereof described in the specification is present and not to exclude presence or a possibility of addition of one or more other features, numbers, steps, operations, configurational elements, parts, or combinations thereof in advance.

Hereinafter, the present invention will be described in detail with reference to the accompanying drawings.

Figure 1:
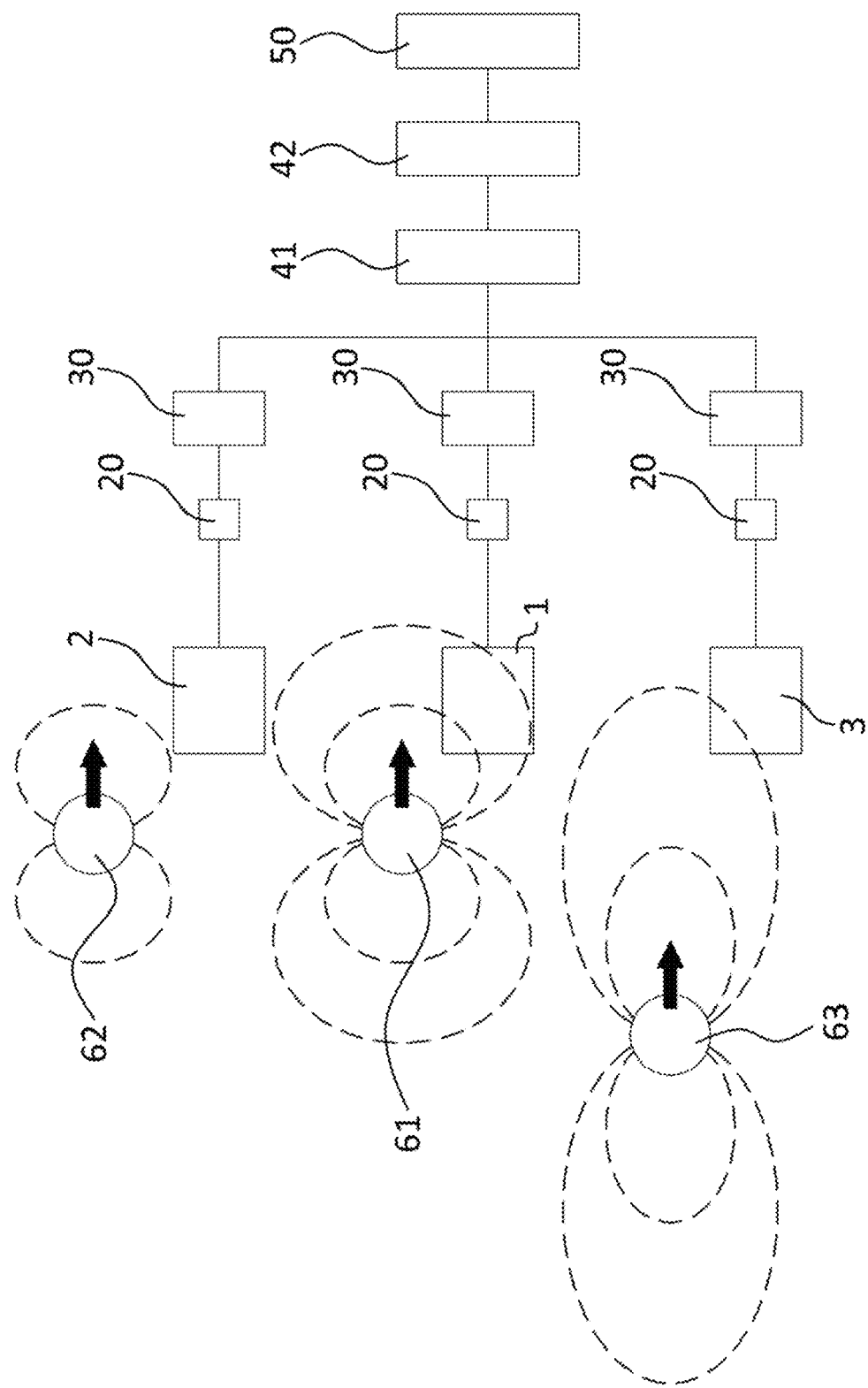
FIGS. 1 and 2 are schematic diagrams illustrating a multi-measurement apparatus according to an embodiment of the present invention.
Figure 2:
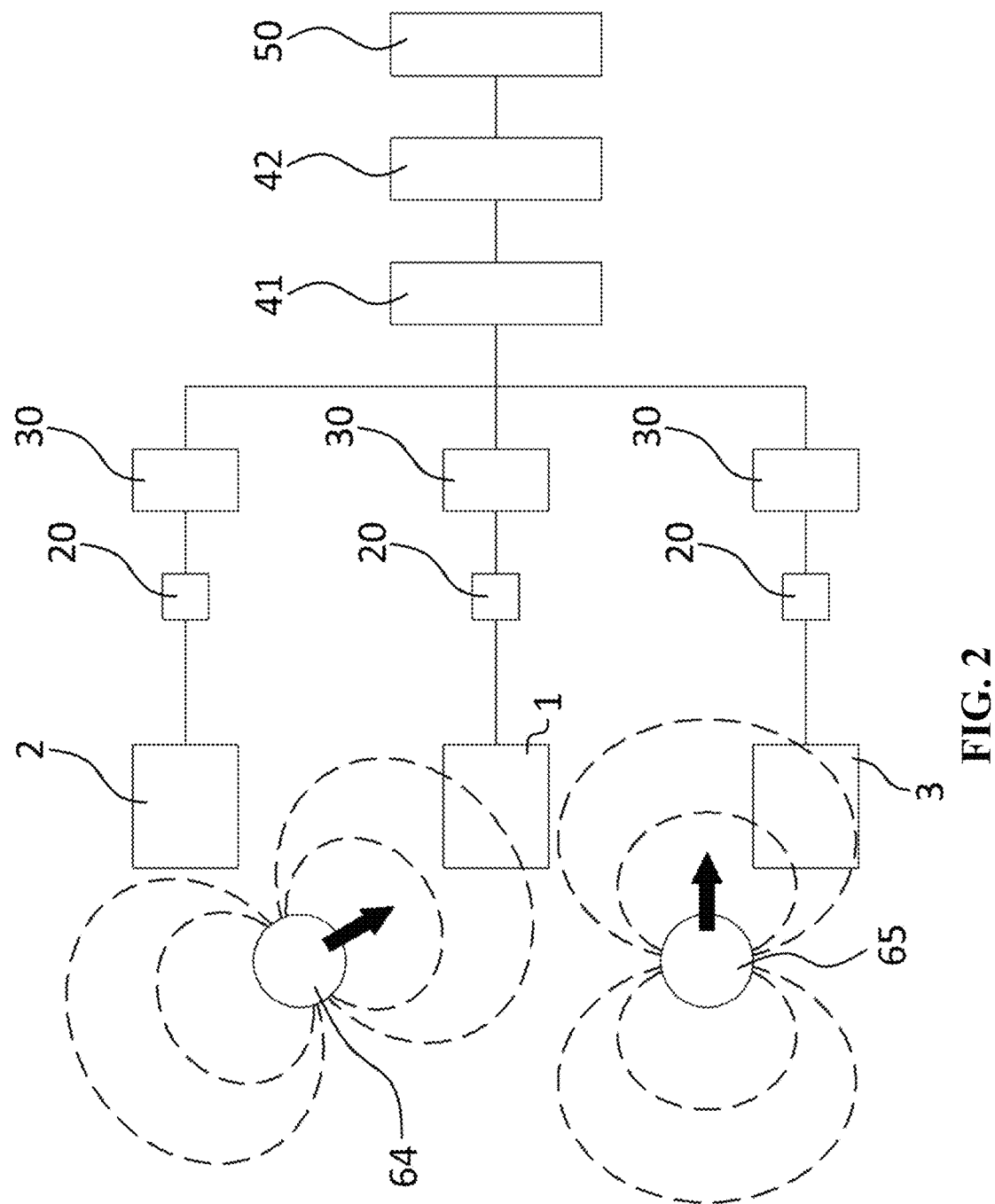
Figure 3:
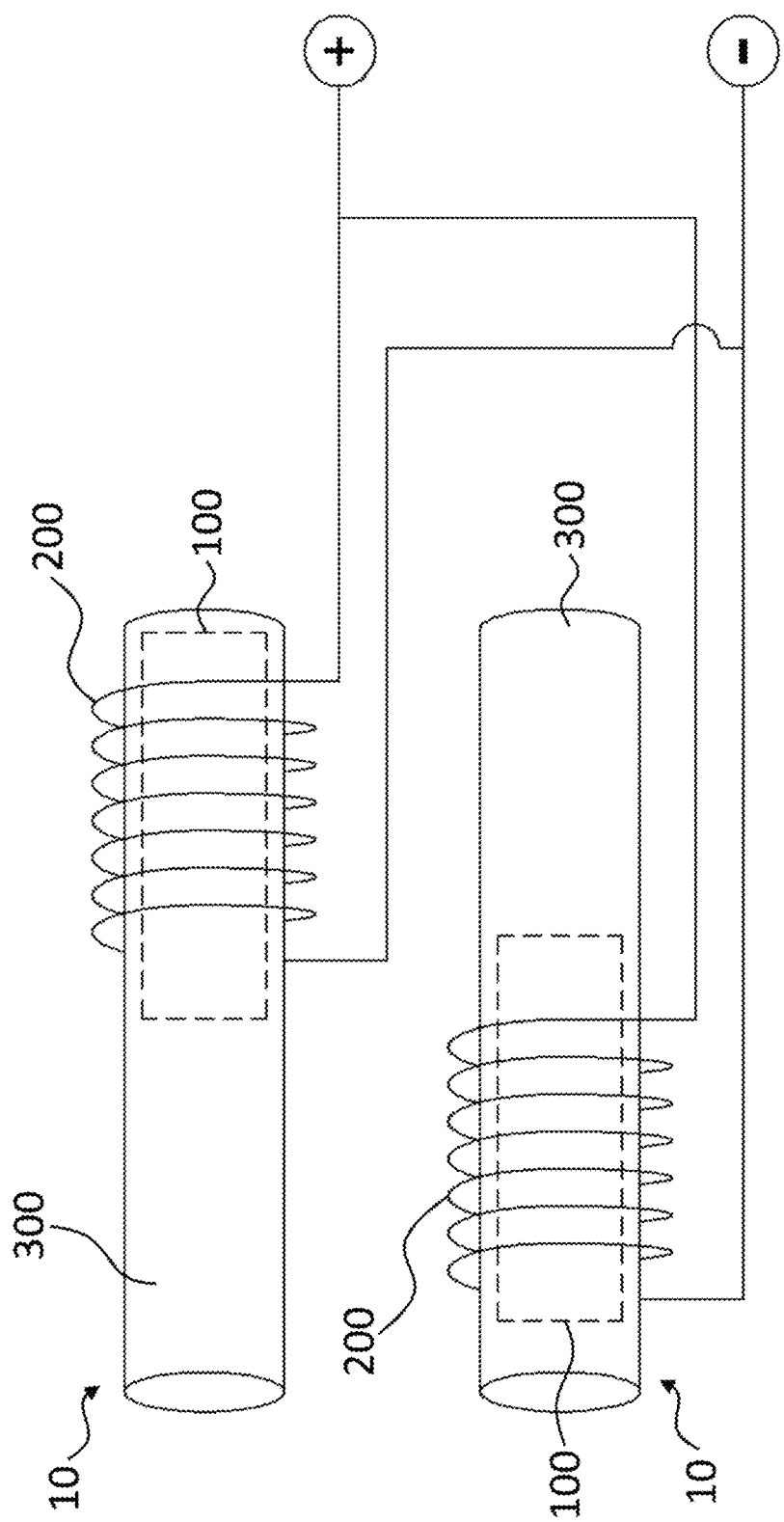
FIG. 3 is a schematic diagram illustrating a sensor according to a first embodiment of the present invention.
Figure 4:
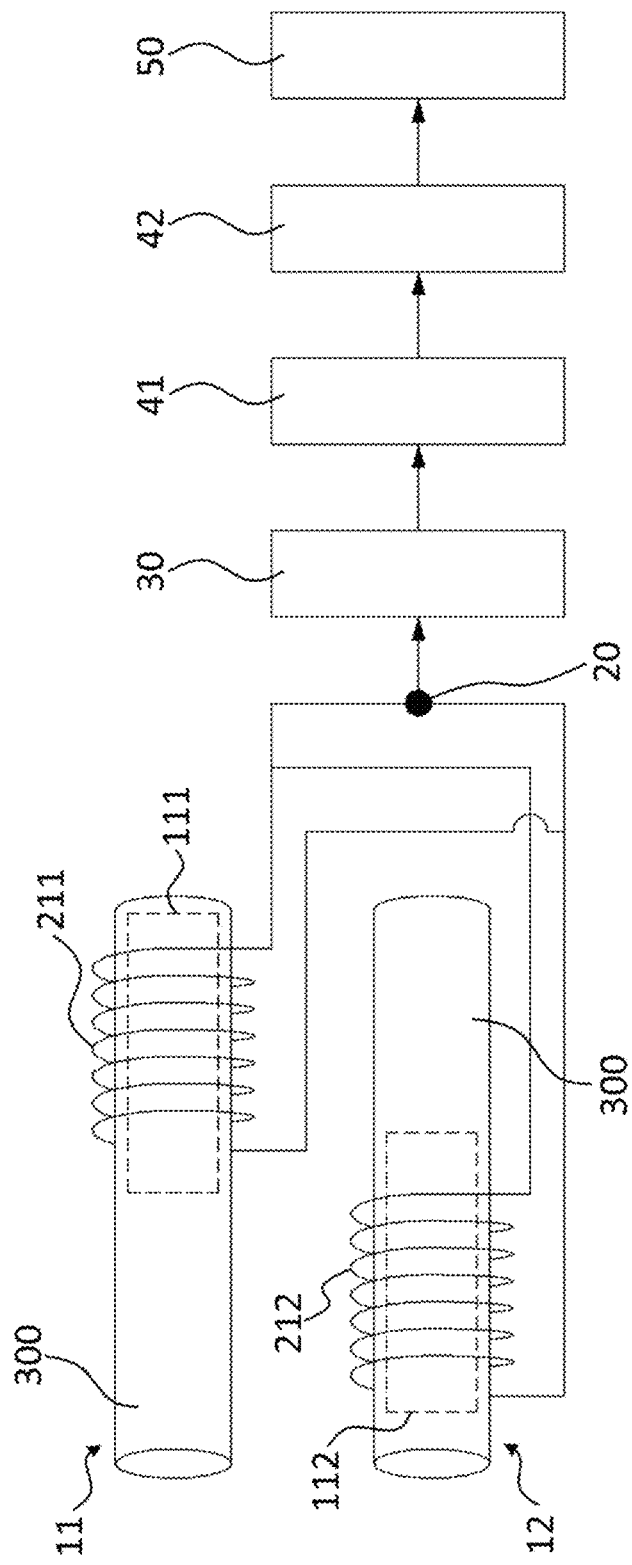
FIG. 4 is a schematic diagram illustrating a sensor module according to the first embodiment of the present invention.
Figure 5:
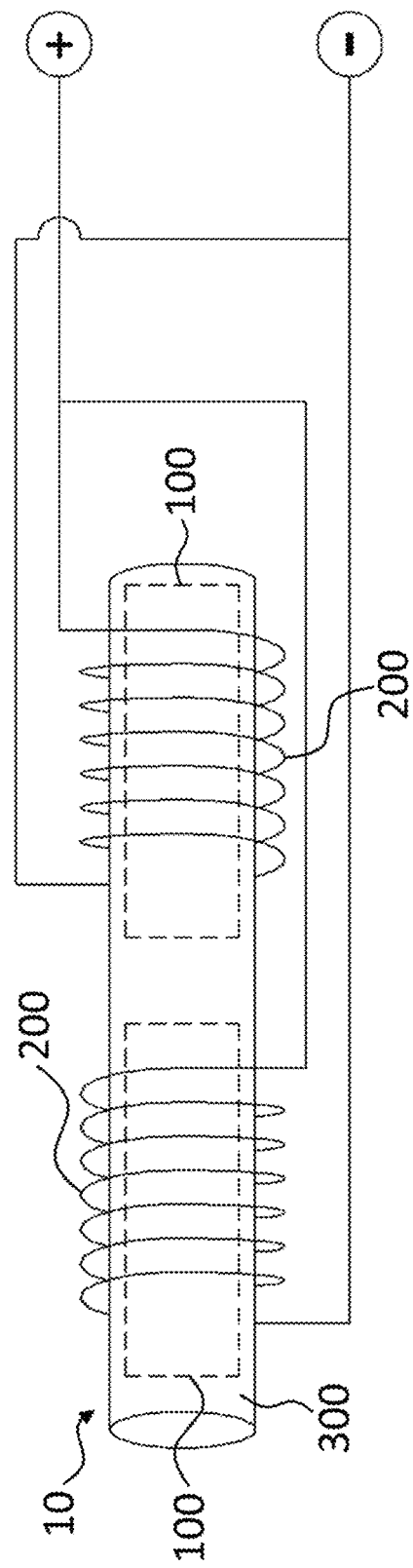
FIG. 5 is a schematic diagram illustrating a sensor according to a second embodiment of the present invention.
Figure 6:
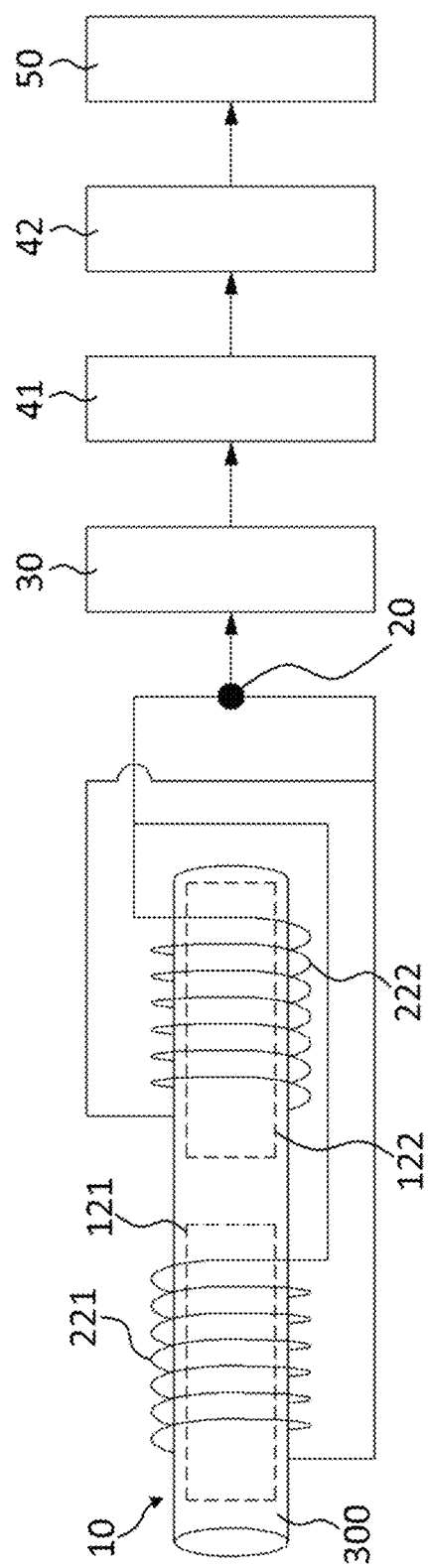
FIG. 6 is a schematic diagram illustrating a sensor module according to the second embodiment of the present invention.
Figure 7:
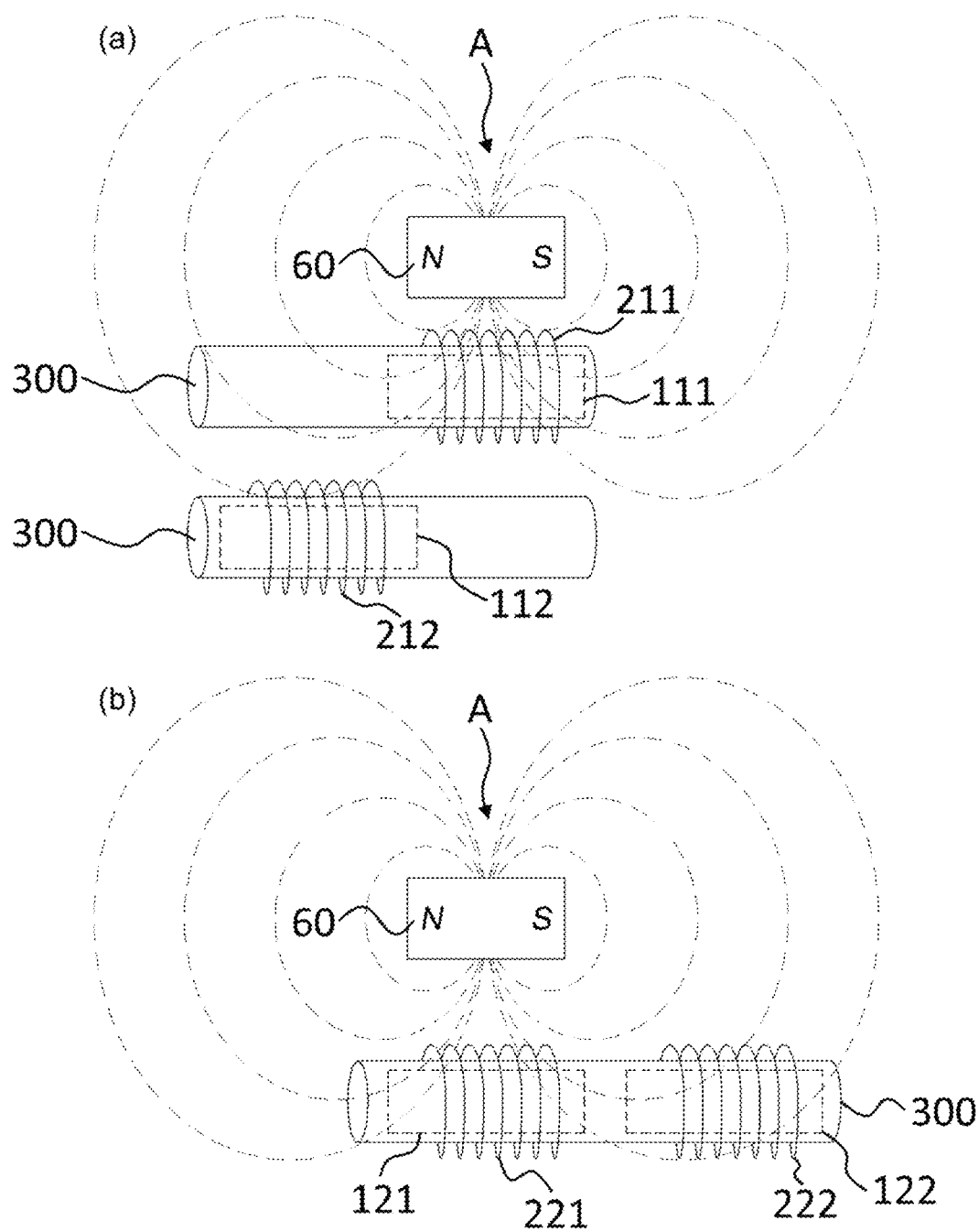
FIG. 7 is a schematic diagram illustrating magnetic field regions of the sensors according to the embodiments of the present invention.
Figure 9:
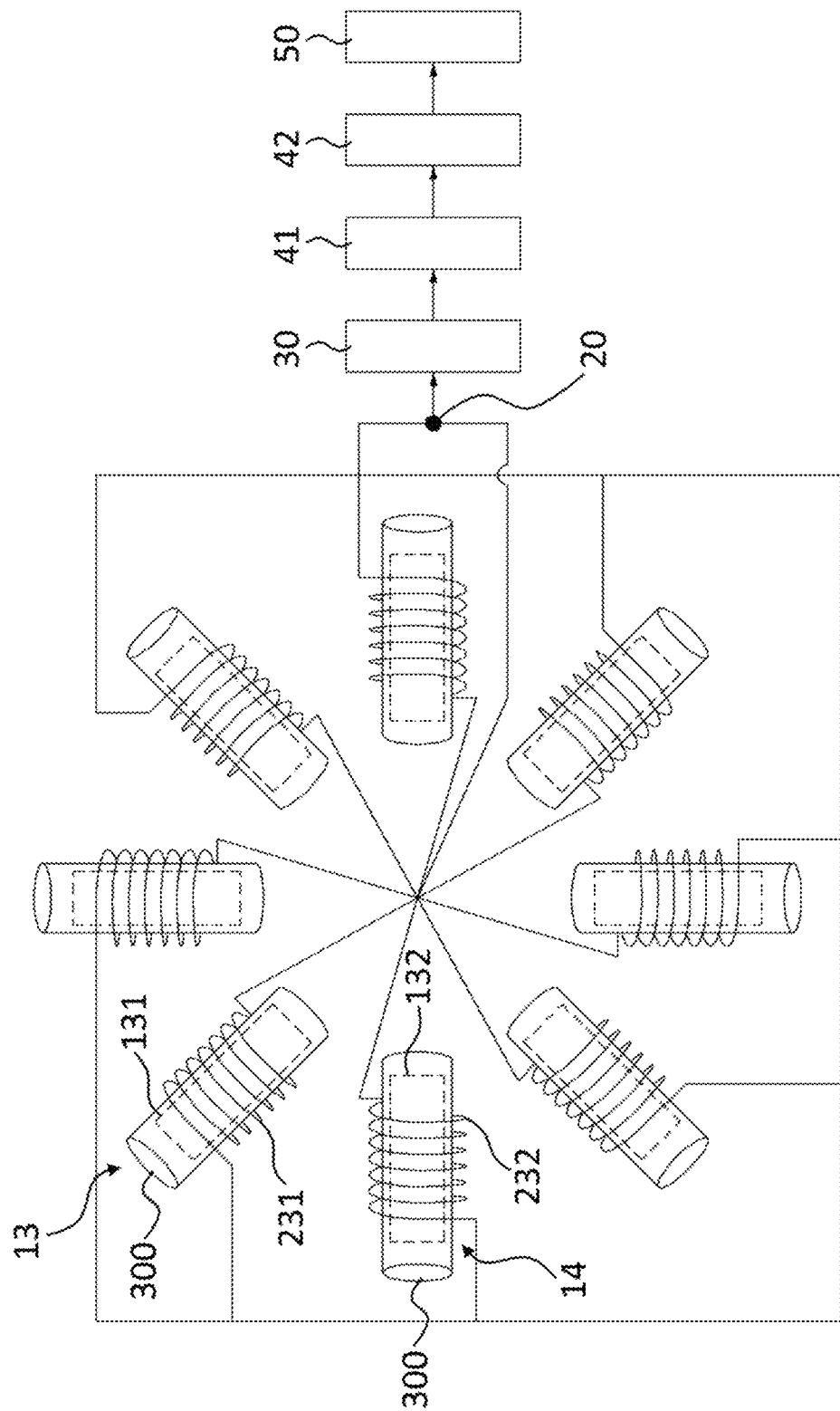
FIG. 9 is a schematic diagram illustrating a sensor module according to the third embodiment of the present invention.

FIGS. 1 and 2 are schematic diagrams illustrating a multi-measurement apparatus according to an embodiment of the present invention. In addition, FIG. 3 is a schematic diagram illustrating a sensor according to a first embodiment of the present invention, and FIG. 4 is a schematic diagram illustrating a sensor module according to the first embodiment of the present invention. In addition, FIG. 5 is a schematic diagram illustrating a sensor according to a second embodiment of the present invention, and FIG. 6 is a schematic diagram illustrating a sensor module according to the second embodiment of the present invention. Further, FIG. 7 is a schematic diagram illustrating magnetic field regions of the sensors according to the embodiments of the present invention. Here, (a) of FIG. 7 is a diagram illustrating a state where an object containing iron (Fe) moves with respect to the sensor module according to the first embodiment of the present invention, and (b) of FIG. 7 is a diagram illustrating a state where the object containing iron (Fe) moves with respect to the sensor module according to the second embodiment of the present invention. Directions can be set based on right, left, top, and bottom of the drawings. Hereinafter, the same is true of the following. In the drawings of the present invention, the object containing iron has marks of the N pole and the S pole; however, the marks are only provided for the convenience of understanding, and the marks do not indicate that the object is a magnet or an electromagnet. In FIGS. 4, 6, and 9, a first control unit and a second control unit are connected by an arrow; however, the arrow only means signal transmission and does not mean that the first control unit and the second control unit are formed separately from each other for each sensor module.

As illustrated in FIGS. 1 and 2, the multi-measurement apparatus of the present invention includes: sensor modules, each of which has one or more sensors 10 including respective housings 300 having respective inner spaces, respective cores 100 formed to be inserted into the inner spaces of the housings 300, and respective coils 200 which are each wound around a portion of an outer circumferential surface of each of the housings 300, the portion corresponding to a position of each of the cores 100; impedance matching units 20 that are connected to a plurality of the sensor modules, respectively, and perform impedance matching; and amplifiers 30 that are connected to the impedance matching units 20, respectively, and amplify a fine current and voltage generated during approach of objects to the sensor modules.

The sensor modules can have respective induced magnetic fields formed due to a change in distance from the objects containing iron (Fe). That is, the sensors 10 can have respective induced magnetic field formed due to a change in distance from the objects containing iron (Fe). This is because the object containing iron (Fe) can have a fine magnetic field due to a property of the iron (Fe) having magnetism, and a movement or direction change of the object containing iron (Fe) can cause the induced magnetic field to be formed in the sensor 10.

Specifically, the core 100 does not contain any magnetic component, and the induced magnetic field can be formed in the sensor 10 due to an approach or separation of the magnetic field of the object containing iron. Further, the generation of the induced magnetic field can cause a fine current and voltage to be generated in the coil 200. That is, the configuration described above enables a magnetic flux quantity having an effect on the core 100 to be detected whenever a location or a direction of the object containing iron (Fe) is changed, even when the core 100 is affected by a nano scale of flux quantity from the object 60 containing iron (Fe) or a magnetic field formed by the object containing iron (Fe) has a magnetic flux density of equal to or smaller than several milligauss.

In order to fulfil a function described above, the core 100 can have good hysteresis characteristics and relatively high permeability. Specifically, in order to form the core 100, metal powder is mixed in proportion of 4.6 to 5.2 wt. % of iron (Fe), 74.3 to 75.6 wt. % of nickel (Ni), 12.5 to 13 wt. % of silicon (Si), 1.5 to 1.6 wt. % of chromium (Cr), and 5.8 to 5.9 wt. % of cobalt (Co) and is molded through the injection molding at a temperature of 1,300° C. or higher into a ribbon (or tape) shape having a thickness of 0.025 mm or smaller considering the permeability and impact having an effect on remote sensing, and a thin and lightweight core can be obtained. In addition, a plurality of thin cores 100 formed as described above can be configured to be overlapped and integrated with each other.

Here, since a nickel content accounts for a significant percent by weight in the core 100, it is important for nickel to be inhibited from dissolving at a low temperature. In addition, since a magnetic characteristic (hysteresis) of cobalt is degraded at a temperature of 1,200 to 1,300° C., it is important not to perform the injection molding at a temperature of 1,300° C. or higher. In addition, since the injection molding is vulnerable to impact, the injection molding has to be performed at a low injection speed and quenched at 106° C./sec such that the core 100 can have durability.

When a plurality of types of metal powder are mixed as described above, the mixed powder is heterogeneous, and thus particles can be arranged by providing a strong magnetic field while a heat treatment of heating the particles at a certain temperature is performed until the particles dissolve, so as for the particles of the mixed powder to maintain an arranged state in a certain direction. In addition, in order for the particles to maintain the arranged state, the core 100 formed in a process described above can be gradually cooled while being located in a magnetic field to be subjected to a magnetic field process. Accordingly, the hysteresis and the permeability of the core 100 can be increased.

As the characteristics of the core 100 becomes better when the thickness is thinner and the core 100 has to be lightweight so as to withstand impact, the core 100 made of an amorphous type of or permalloy metal is preferable; however, the permalloy metal has a higher degree of change due to impact than the amorphous metal does, and thus the amorphous core 100 can be used in the multi-measurement apparatus of the present invention.

The housing 300 can be formed into a cylindrical shape having an inner space, and the housing 300 can be made of an insulation material. In addition, the core 100 which is a passage of magnetic flux induced by the coil 200 can be formed in the inner space of the housing 300 corresponding to a position of the coil 200. Further, the coil 200 can be made of a metal wire such as an iron wire, a nichrome wire, or a copper wire.

The multi-measurement apparatus of the present invention can measure movement of one or more objects 60. Further, the multi-measurement apparatus can measure the number and a magnetic flux density of the objects 60, as well as a location, a direction, a speed, or the like related to the movement of the objects 60. In an embodiment of the present invention, the plurality of sensor modules can be formed, and the impedance matching units 20 and the amplifiers 30 can be connected to the plurality of sensor modules, respectively. In addition, the multi-measurement apparatus of the present invention can further include: a first control unit 41 that is connected to the plurality of amplifiers 30 and analyzes a waveform (signal pattern) of the amplified current and voltage; and a second control unit 42 that is connected to the first control unit 41 and analyzes movement of the objects.

In the embodiment of the present invention, the sensor modules (first to third sensor modules) are described to be arranged side by side at regular intervals; however, arrangement thereof is not limited thereto, and the arrangement of the sensor modules can be modified depending on a use of the multi-measurement apparatus of the present invention.

As illustrated in FIGS. 1 and 2, the multi-measurement apparatus of the present invention can analyze movement paths, movement speeds, or the like using locations, directions, and speeds of the plurality of objects 61 to 65, respectively, and can analyze relative movement between one object and another object.

As a specific embodiment, as illustrated in FIG. 1, a first object 61 can move from left to right on the drawing toward a space between a first sensor module 1 and a second sensor module 2, a second object 62 can move toward a space above the second sensor module 2 based on the drawing, and a second third object 63 can move toward a space between the first sensor module 1 and a third sensor module 3. Here, the first object 61 can have a magnetic flux density of $5 \times 10^{-17}$ T (Tesla) and a speed of 4 km/h (normal walking speed of a person), the second object 62 can have a magnetic flux density of $3 \times 10^{-17}$ T (Tesla) and a speed of 4 km/h, and the third object 63 can have a magnetic flux density of $5 \times 10^{-17}$ T (Tesla) and a speed of 6 km/h.

Further, as illustrated in FIG. 2, a fourth object 64 can move in a direction from the second sensor module 2 toward the first sensor module 1, and a fifth object 65 can move toward the first sensor module 1 and the third sensor module 3. Here, the fourth object 64 can have a magnetic flux density of $5 \times 10^{-17}$ T (Tesla) and a speed of 4 km/h, and the fifth object 65 can have a magnetic flux density of $5 \times 10^{-17}$ T (Tesla) and a speed of 6 km/h.

First, in analysis of the number of objects 60, when the first object 61, the second object 62, and the third object 63 move as described above, sensors of the first sensor module 1, the second sensor module 2, and the third sensor module 3 can generate signals depending on movements of the objects, respectively, and all of the signals of the sensors can be transmitted to the first control unit 41 through the impedance matching units 20 and the amplifiers 30 connected to the respective sensor modules. The first control unit 41 can analyze a plurality of such signal patterns, thereby, determining the number of objects 60 which pass adjacent to the respective sensor modules. The first control unit 41 stores data of respective signal patterns based on magnetic flux densities and speeds of the objects 60 and data of a compound pattern obtained when two or more signal patterns are superimposed, and the first control unit 41 can calculate the number of unique signal patterns of the objects 60 by analyzing the respective signal patterns, thereby analyzing the number of objects 60 which pass by the multi-measurement apparatus of the present invention. Here, data of signal patterns or compound patterns can be stored through experiments. However, another technology in the related art can be used as a signal separating technology for identifying the objects 60. This can be also applied to a case where the fourth object 64 and the fifth object 65 move. As a result, through analysis performed by the first control unit 41, the objects 60 can be individually identified, and signal patterns of the objects 60 can be separated from each other.

Further, in the analysis of the movement paths, the movement speeds, and the magnetic flux densities of the objects 60, the objects 60 are individually identified by the signal pattern analysis performed by the first control unit 41, and respective signal patterns of the objects 60 can be transmitted to the second control unit 42. Further, the second control unit 42 can analyze the movement paths and the movement speeds of the objects 60 by analyzing the respective signal patterns.

Specifically, as illustrated in FIG. 1, when the first object 61, the second object 62, and the third object 63 move rectilinearly in one direction (reference direction), the objects 60 can be individually identified as described above, and thereby the signal patterns of the objects 60 can be separated from each other by the first control unit 41 and be transmitted to the second control unit 42. Here, the second control unit 42 can analyze that the objects 60 form respective signal patterns, each of which has certain strength, with respect to the respective sensor modules, thus determining that the first object 61, the second object 62, and the third object 63 move in the same direction and determining the magnetic flux densities and the movement speeds of the objects 60 based on the respective signal patterns of the objects 60. Here, similarly to the first control unit 41, the second control unit 42 can store data of respective signal patterns depending on the magnetic flux densities and the speeds of the objects 60, and the second control unit 42 can use the stored data.

Further, as illustrated in FIG. 2, when the fourth object 64 and the fifth object 65 move in respective directions different from each other, the objects 60 can be individually identified as described above, and thereby the signal patterns of the objects 60 can be separated from each other by the first control unit 41 and be transmitted to the second control unit 42. Here, the second control unit 42 can analyze a phenomenon in which the strength of a signal pattern of the fourth object 64 gradually increases in the first sensor module 1 and gradually decreases in the second sensor module 2, a pattern of a strength change thereof, or the like, thereby determining that the fourth object 64 moves to form a certain angle with respect to a reference direction (direction in which the fifth object 65 moves) and determining the magnetic flux density and the movement speed based on the signal pattern of the fourth object 64. The analysis of the movement of the fifth object 65 can be similar to the analysis of the first object 61 and the like described above.

The second control unit 42 can discriminate between the objects 60 having respective magnetic flux densities within a predetermined magnetic flux density range. That is, the second control unit 42 can determine whether or not a specific object 60 passes by the multi-measurement apparatus of the present invention. Specifically, as described above, the first control unit 41 can identify the individual objects, separate the signal patterns of the individual objects, and transmit the separated signal patterns to the second control unit 42, and the second control unit 42 can analyze the transmitted signal patterns of the objects 60 to determine whether a magnetic flux density of a corresponding object is within a predetermined magnetic flux density range. Since the objects can have respective different amounts of iron component so as to have respective different magnetic flux densities and the magnetic flux density of a specific object category can be within a predetermined magnetic flux density range, the second control unit 42 can determine whether an object 60 belongs to the specific object category using the magnetic flux density of the object. Specifically, firearms can contain a relatively high density of iron component due to a forging process, thus having a relatively high magnetic flux density. Accordingly, the magnetic flux density of the firearms can form a predetermined magnetic flux density, and the second control unit 42 can discriminate an object as a firearm when a magnetic flux density of the corresponding object is within a magnetic flux density of the firearms.

The multi-measurement apparatus of the present invention can further include an output unit 50 that is connected to the second control unit 42 and visually output locational changes of the objects. The output unit 50 can receive information from the second control unit 42, display a three-dimensional coordinate change of the movement path of the object 60 on a graph, an image, or the like, and display numerical value information of the movement speed, the magnetic flux density, or the like of the object 60 on a screen.

Figure 8:
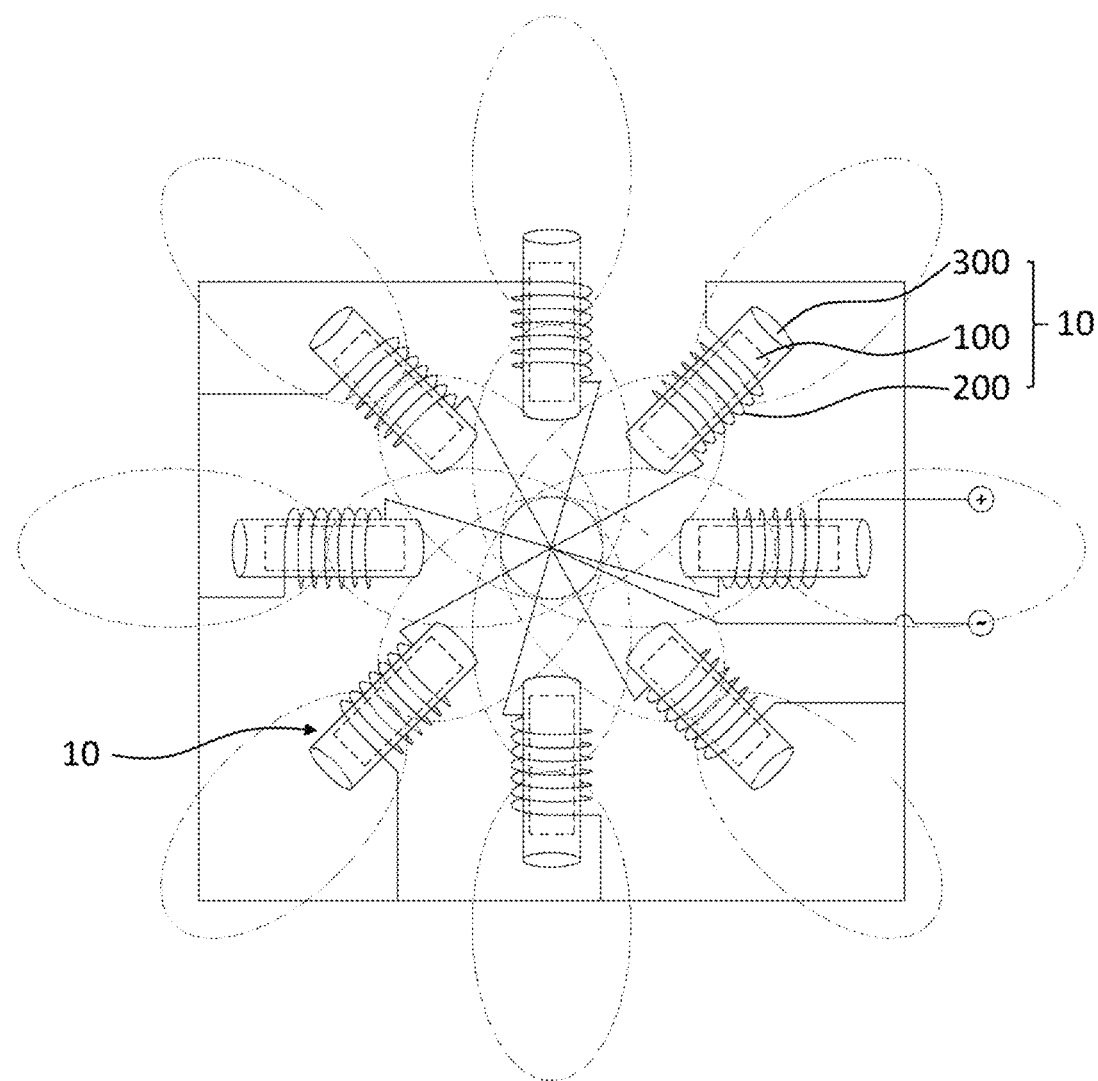
FIG. 8 is a schematic diagram illustrating a sensor according to a third embodiment of the present invention.
Figure 10:
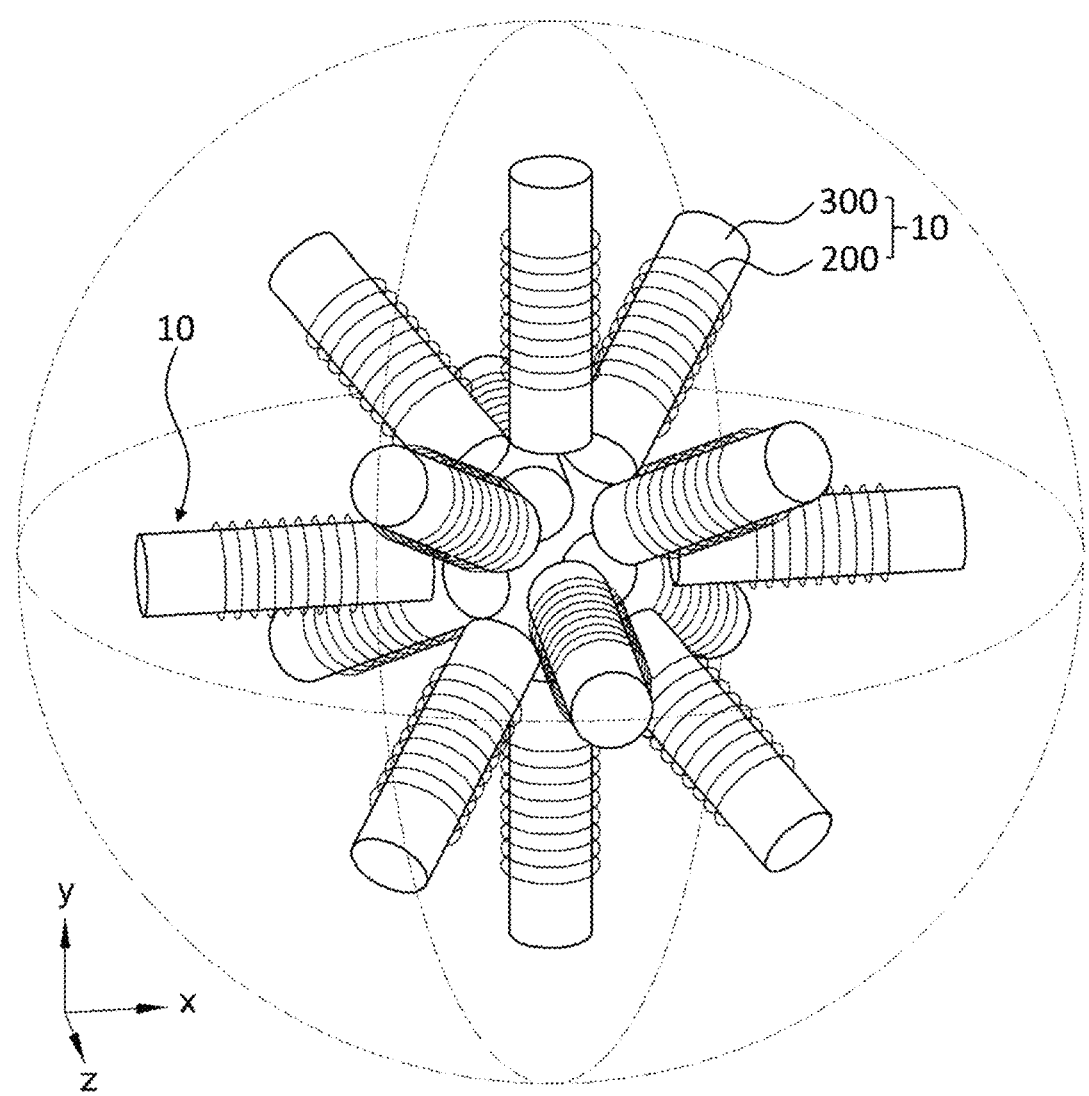
FIG. 10 is a schematic diagram illustrating a sensor module according to a fourth embodiment of the present invention.

Hereinafter, installation of the sensors 10 included in the sensor module will be described. FIG. 8 is a schematic diagram illustrating a sensor according to a third embodiment of the present invention, and FIG. 9 is a schematic diagram illustrating a sensor module according to the third embodiment of the present invention. Further, FIG. 10 is a schematic diagram illustrating a sensor module according to a fourth embodiment of the present invention.

As illustrated in FIGS. 3, 4, and 7 to 10, a plurality of sensors 10 can be arranged in parallel or radially with each other. First, a case where the plurality of sensors 10 are arranged in parallel with each other is to be described.

As illustrated in FIGS. 3 and 4, the plurality of sensors 10 can be arranged in parallel with each other, and a position of a core 100 and a coil 200 with respect to one housing 300 can differ from a position of a core 100 and a coil 200 with respect to another housing 300. Specifically, of the plurality of sensors 10, a 1-1st sensor 11 and a 1-2nd sensor 12 can be formed in parallel to be positioned side by side, a 1-1st core 111 and a 1-1st coil 211 can be formed at a right portion of the first sensor 10, and a 1-2nd core 112 and a 1-2nd coil 212 can be formed at a left portion of the second sensor 10.

As illustrated in FIGS. 3, 4, and 7, when the object 60 containing iron (Fe) moves to approach the sensor 10 from the left side to the right side of the drawings, a change in magnetic field momentarily occurs in the core 100, and thus a fine voltage and current can be induced to be formed in the coil 200. In this case, when a non-polarity part (represented by Reference sign A in FIG. 7) as a part in which N pole and S pole of the object 60 containing iron (Fe) is switched passes by the 1-1st core 111, the generation of the voltage and the current induced by the 1-1st core 111 and the 1-1st coil 211 provided in the 1-1st sensor 11 can be stopped. Here, not only when a magnetic line of force does not affect the 1-1st core 111 and the 1-1st coil 211 at all due to the non-polarity part, but also when the magnetic line of force partially affects the 1-1st core 111 and the 1-1st coil 211 as illustrated in FIG. 7, the magnetic flux density can be remarkably reduced in the vicinity of the non-polarity part such that generation of an induced voltage and current can be stopped.

On the other hand, at the same time, since the 1-2nd core 112 and the 1-2nd coil 212 provided in the 1-2nd sensor 12 are affected by distortion of a magnetic field through the N or S pole which is generated by the object 60 containing iron (Fe), that is, affected by magnetic field movement of the object 60 containing iron (Fe), a fine voltage and current can be induced in the 1-2nd coil 212.

Further, one end of a coil 200 provided in one sensor 10 can be connected to one end of a coil 200 provided in another sensor 10, and the other end of the coil 200 provided in the one sensor 10 can be connected to the other end of the coil 200 provided in the other sensor 10. Accordingly, a lead wire of the one sensor 10 and a lead wire of the other sensor 10 can be connected to have the same signal.

Specifically, when an induced magnetic field is generated to the core 100 and the coil 200 (the 1-1st core 111 and the 1-1st coil 211) provided in the one sensor 10 and the core 100 and the coil 200 (the 1-2nd core 112 and the 1-2nd coil 212) provided in the other sensor 10, a fine current and voltage can be generated in the coil 200 provided in the one sensor 10 such that a +pole and a −pole can be formed therein, and similarly, a fine current and voltage can be formed in the coil 200 provided in the other sensor 10 such that a +pole and a −pole can be formed therein. In this case, the +pole of the coil 200 provided in the one sensor 10 can be connected to the +pole of the coil 200 provided in the other sensor 10, and the −pole of the coil 200 provided in the one sensor 10 can be connected to the −pole of the coil 200 provided in the other sensor 10.

Even when the non-polarity part of the object 60 containing iron (Fe) passes by one sensor 10 as described above and the generation of the current and the voltage is stopped in the coil 200 provided in the one sensor 10, the connection of the same signal as described above enables the current and the voltage to be generated in the coil 200 provided in the other sensor 10 such that the sensor 10 can be continuously and normally operated.

The impedance matching unit can be connected to lead wires connected to the plurality of coils 200, respectively, and perform impedance matching. The impedance matching unit 20 can maximize a signal transmission efficiency by reducing a loss of signal by reducing reflection due to an impedance difference between signals (fine current or voltage) transmitted from both ends of each of the sensors 10. Further, the amplifier 30 can include an amplification circuit for amplifying a transmitted signal, amplify the signal transmitted from the impedance matching unit 20, and transmit the amplified signal to the first control unit 41.

The first control unit 41 can determine whether displacement occurred to the object 60 containing iron (Fe) or displacement occurred to the sensor modules by analyzing a waveform of an amplified signal.

The first control unit 41 can be realized by a signal processing module such as a microcomputer or an FPGA, and a software algorithm (SW algorithm) can be applied thereto. The SW algorithm can determine whether the displacement occurred to the object 60 containing iron (Fe), the sensors 10 provided in the sensor module, or both the object and the sensors based on whether information of a signal pattern obtained during the occurrence of displacement to the sensors 10 and a signal pattern obtained during movement of the object 60 containing iron (Fe) is different.

Specifically, since the sensors 10 respond to a fine magnetic field, in a case where the displacement occurred to the sensor 10, the signal pattern can be formed by being affected by a change in magnetic field of the Earth, magnetic field of another object 60 around the sensor, or the like, in addition to a magnetic field change due to the occurrence of relative displacement of the sensor 10 with respect to the object 60 containing iron (Fe), while in a case where the displacement occurred to the object 60 containing iron (Fe), the sensor 10 is affected only by a change in magnetic field due to the occurrence of the relative displacement with respect to the object 60 containing iron (Fe). Hence, different signal patterns can be formed depending on both the cases. Further, similarly, in a case where displacement occurred to the object 60 containing iron (Fe) and the sensors 10 simultaneously, another signal pattern can be formed.

As described above, different signal pattern can be formed depending on cases, and the signal patterns formed for each cases can be stored in the first control unit 41 and form reference data. Here, the signal pattern stored in the reference data of the first control unit 41 can be experimentally derived. The first control unit 41 can analyze similarity or the like by determining through comparison between a signal pattern transmitted from the amplifier 30 and the signal pattern in the reference data of the first control unit 41, thereby performing determination of whether the displacement occurred to the object 60 containing iron (Fe) or the sensors 10.

The second control unit 42 can receive, from the first control unit 41, information of whether the displacement occurred to the object 60 containing iron (Fe) or the displacement occurred to the sensors 10 and data of a waveform of the signal pattern and analyze an actual displacement path of a displaced agent. The second control unit 42 can be realized by a signal processing module such as a microcomputer or an FPGA, and a software algorithm (SW algorithm) can be applied thereto.

Specifically, the signal pattern for the occurrence of displacement of the object 60 containing iron (Fe), the signal pattern for the occurrence of displacement of the sensors 10, or the signal pattern for the simultaneous occurrence of displacement of the object 60 containing iron (Fe) and the sensors 10 can be all stored in the second control unit 42 and form reference data. Here, the signal patterns stored in the reference data of the second control unit 42 can be experimentally derived.

The second control unit 42 can first confirm a displaced agent based on the information transmitted from the first control unit 41, select a data category related to a displaced agent from the reference data of the second control unit 42, and then analyze similarity by determining through comparison between the waveform of the signal pattern transmitted from the first control unit 41 and the signal pattern in the reference data of the second control unit 42, thereby, performing a coordinate change based on the occurrence of the displacement of the object 60 containing iron (Fe), a coordinate change based on the occurrence of the displacement of the sensors module, or the like.

In the embodiment of the present invention, the first control unit 41 and the second control unit 42 are described to be sequentially connected to each other; however, connection thereof is not limited thereto, and the first control unit 41 and the second control unit 42 can be configured simultaneously or independently.

That is, as described above, the first control unit can determine whether the displacement occurred to the object 60 or the sensor module in addition to identifying the object 60 by separating the signal patterns, the second control unit 42 can analyze the movement path and the movement speed of an object and simultaneously analyze a movement path of the sensor module.

Next, a case where the plurality of sensors 10 are arranged radially with each other is to be described. In FIGS. 8 and 10, regions enclosed by two-dot chain lines may indicate measurable regions (ranges) of the sensors 10 corresponding to the respective regions.

In FIGS. 8 and 10, for the convenience of understanding, the measurable regions of the sensors 10 are illustrated to be rather small; however, the measurable region is not limited thereto, and the measurable regions of the sensors 10 can be formed to be larger. Further, in FIG. 10, for the convenience of understanding, connection or the like of lead wires is omitted, and only arrangement of the sensors 10 is illustrated.

As illustrated in FIGS. 8 to 10, the plurality of sensors 10 can be radially arranged. Specifically, of the plurality of sensors 10, a 3-1st sensor 13 and a 3-2nd sensor 14 can be radially formed (other sensors are also radially formed; however, for the convenience of understanding, only the 3-1st sensor 13 and the 3-2nd sensor 14, to which Reference signs are assigned, are to be described.).

As described above, when the plurality of sensors 10 are radially arranged, the measurable regions of the plurality of sensors 10 can be formed to be contiguous to each other or to intersect with each other such that the detection efficiency of the object by The multi-measurement apparatus of the present invention can be remarkably improved. In particular, as illustrated in FIG. 10, when the plurality of sensors 10 are arranged in a three-dimensionally radial shape, the measurable regions of the plurality of sensors 10 can be formed into spherical shapes. Hence, not only can the detection efficiency be increased as described above, but also an advantage of easy detection of the object can be obtained even when the object moves toward any of an x axis, a y axis, and a z axis. Further, when the sensors 10 are separately disposed from each other, arrangement with consideration for the measurable regions of the sensors 10 may not be easy. However, when The multi-measurement apparatus of the present invention which is formed as described above, in which the plurality of sensors 10 are radially arranged, is used, the measurable region can be formed into a cylindrical or spherical shape, and thereby the measurable regions can be easily calculated such that detection region design of the object can be easily performed.

As illustrated in FIGS. 8 to 10, when the object 60 containing iron (Fe) moves to approach the sensor 10 from the left side to the right side of the drawings, a change in magnetic field momentarily occurs in the core 100, and thus a fine voltage and current can be induced and formed in the coil 200. In this case, when the non-polarity part as a part in which N pole and S pole of the object 60 containing iron (Fe) is switched passes by a 3-1st core 131, the generation of the voltage and the current induced by the 3-1st core 131 and a 3-1st coil 231 provided in the 3-1st sensor 13 can be stopped. Here, not only when a magnetic line of force does not affect the 3-1st core 131 and the 3-1st coil 231 at all due to the non-polarity part, but also when the magnetic line of force partially affects the 3-1st core 131 and the 3-1st coil 231, the magnetic flux density can be remarkably reduced in the vicinity of the non-polarity part such that generation of an induced voltage and current can be stopped.

On the other hand, at the same time, since the 3-2nd core 132 and the 3-2nd coil 232 provided in the 3-2nd sensor 14 are affected by distortion of a magnetic field through the N or S pole which is generated by the object 60 containing iron (Fe), that is, affected by magnetic field movement of the object 60 containing iron (Fe), a fine voltage and current can be induced in the 3-2nd coil 232.

Further, one end of a coil 200 provided in one sensor 10 can be connected to one end of a coil 200 provided in another sensor 10, and the other end of the coil 200 provided in the one sensor 10 can be connected to the other end of the coil 200 provided in the other sensor 10. Accordingly, a lead wire of the one sensor 10 and a lead wire of the other sensor 10 can be connected to have the same signal.

Specifically, when an induced magnetic field is generated to the core 100 and the coil 200 (the 3-1st core 131 and the 3-1st coil 231) provided in the one sensor 10 and the core 100 and the coil 200 (the 3-2nd core 132 and the 3-2nd coil 232) provided in the other sensor 10, a fine current and voltage can be generated in the coil 200 provided in the one sensor 10 such that a +pole and a −pole can be formed therein, and similarly, a fine current and voltage can be formed in the coil 200 provided in the other sensor 10 such that a +pole and a −pole can be formed therein. In this case, the +pole of the coil 200 provided in the one sensor 10 can be connected to the +pole of the coil 200 provided in the other sensor 10, and the −pole of the coil 200 provided in the one sensor 10 can be connected to the −pole of the coil 200 provided in the other sensor 10.

Even when the non-polarity part of the object 60 containing iron (Fe) passes by one sensor 10 as described above and the generation of the current and the voltage is stopped in the coil 200 provided in the one sensor 10, the connection of the same signal as described above enables the current and the voltage to be generated in the coil 200 provided in the other sensor 10 such that the sensor 10 can be continuously and normally operated.

The description of the rest of the impedance matching units 20, the amplifiers 30, the first control unit 41, and the second control unit 42 is the same as the description of the impedance matching units 20, the amplifiers 30, the first control unit 41, and the second control unit 42 when the plurality of sensors 10 are arranged in parallel with each other.

As illustrated in FIGS. 5 to 6, the plurality of coils 200 provided in the sensor 10 can be arranged in series with each other. That is, in the sensor 10 provided in the sensor module, the plurality of coils 200 can be arranged in series with each other, and one core 100 can be formed to be separated from another core 100. Specifically, a 2-1st coil 221 and a 2-2nd coil 222 can be formed in series at one housing 300, and a 2-1st core 121 and a 2-2nd core 122 can be formed to correspond to the coils. Here, the sensor module can include one or more sensors 10.

As illustrated in FIGS. 5, 6, and 7, when the object 60 containing iron (Fe) moves to approach the sensor 10 from the left side to the right side of the drawings, a change in magnetic field momentarily occurs in the core 100, and thus a fine voltage and current can be induced to be formed in the coil 200. In this case, when a non-polarity part (represented by Reference sign A in FIG. 7) as a part in which N pole and S pole of the object 60 containing iron (Fe) is switched passes by the 2-1st core 121, the generation of the voltage and the current induced by the 2-1st core 121 and the 2-1st coil 221 can be stopped. Here, not only when a magnetic line of force does not affect the 2-1st core 121 and the 2-1st coil 221 at all due to the non-polarity part, but also when the magnetic line of force partially affects the 2-1st core 121 and the 2-1st coil 221 as illustrated in FIG. 7, the magnetic flux density can be remarkably reduced in the vicinity of the non-polarity part such that generation of an induced voltage and current can be stopped.

On the other hand, at the same time, since the 2-2nd core 122 and the 2-2nd coil 222 are affected by distortion of a magnetic field through the N or S pole which is generated by the object 60 containing iron (Fe), that is, affected by magnetic field movement of the object 60 containing iron (Fe), a fine voltage and current can be induced in the 2-2nd coil 222.

Further, one end of one coil 200 of the plurality of coils 200 can be connected to one end of another coil 200, and the other end of the one coil 200 can be connected to the other end of the other coil 200. Accordingly, a lead wire of the one coil 200 and a lead wire of the other coil 200 can be connected to have the same signal.

Specifically, when an induced magnetic field is generated to one coil 200 (2-1st coil 221) and another coil 200 (2-2nd coil 222), a fine current and voltage can be formed in the one coil 200 such that a +pole and a −pole can be formed therein, and similarly, a fine current and voltage can be formed in the other coil 200 such that a +pole and a −pole can be formed therein. In this case, the +pole of the one coil 200 can be connected to the +pole of the other coil 200, and the −pole of the one coil 200 can be connected to the −pole of the other coil 200.

Even when the non-polarity part of the object 60 containing iron (Fe) passes by one sensor 10 as described above and the generation of the current and the voltage is stopped in the coil 200 provided in the one sensor 10, the connection of the same signal as described above enables the current and the voltage to be generated in the coil 200 provided in the other sensor 10 such that the sensor 10 can be continuously and normally operated.

The description of the rest of the impedance matching units, the amplifiers, the first control unit, and the second control unit is the same as the description of the impedance matching units, the amplifiers, the first control unit, and the second control unit when the plurality of sensors are arranged in parallel with each other.

In the embodiments of the present invention, the parallel arrangement of the sensors 10 in the sensor module and the serial arrangement of the coils 200 in the sensor 10 are described separately from each other. However, the multi-measurement apparatus of the present invention can be formed to include a plurality of sensors 10 in which the coils 200 are arranged in series in one sensor 10, with the sensors 10 being arranged in parallel, and the coils 200 are provided at different respective positions with respect to each of the sensors 10 so as to inhibit an effect of the non-polarity part of the object 60 containing iron (Fe). Such a configuration and principle described above can also be applied such a case described above in the same manner.

Figure 11:
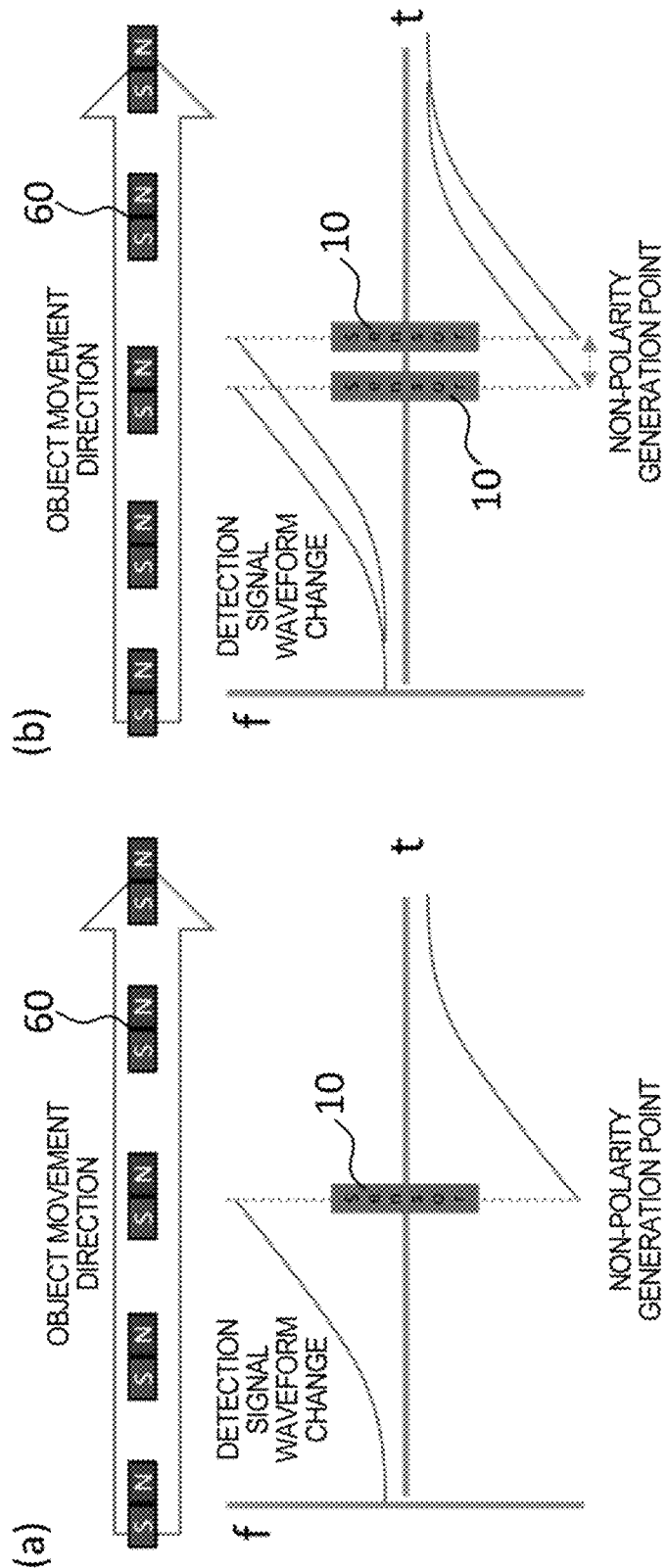
FIGS. 11 and 12 illustrate signal pattern graphs obtained in a state where an object passes by the sensor according to the first embodiment of the present invention.
Figure 12:
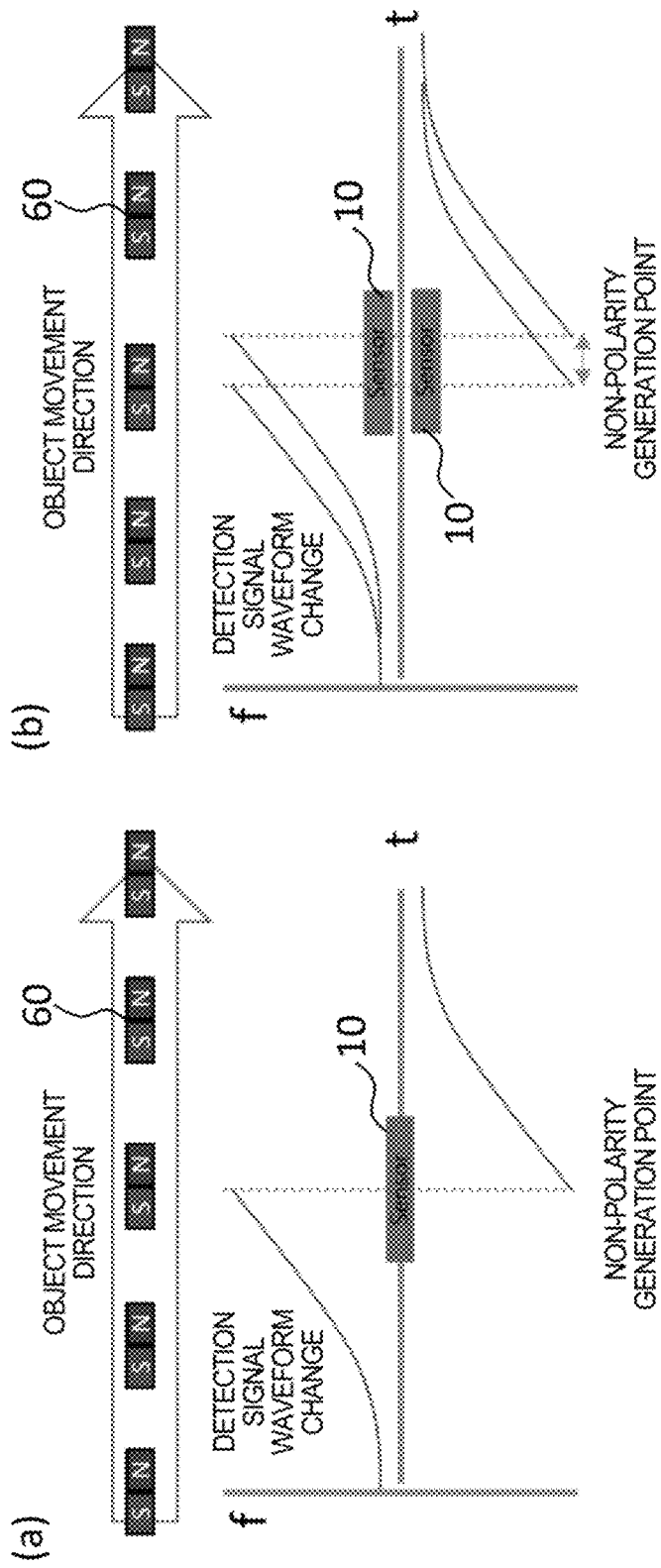

FIGS. 11 and 12 illustrate signal pattern graphs obtained in a state where the object passes by the sensor according to the first embodiment of the present invention. Specifically, (a) of FIG. 11 illustrates a graph obtained in a state where a single sensor 10 according to the first embodiment of the present invention is formed and a lengthwise axis of the sensor 10 is perpendicular to the ground, and (b) of FIG. 11 illustrates a graph obtained in a state where the sensors 10 according to the first embodiment of the present invention are arranged in parallel with each other and lengthwise axes of the sensors 10 are perpendicular to the ground. Further, (a) of FIG. 12 illustrates a graph obtained in a state where a single sensor 10 according to the first embodiment of the present invention is formed and a lengthwise axis of the sensor 10 is horizontal to the ground, and (b) of FIG. 12 illustrates a graph obtained in a state where the sensors 10 according to the first embodiment of the present invention are arranged in parallel with each other and lengthwise axes of the sensors 10 are horizontal to the ground.

As illustrated in FIGS. 11 and 12, when the multi-measurement apparatus of the present invention is used, it is possible to confirm easy performance of the detection of the object 60 by using the sensors 10, regardless of whether the lengthwise axis of the sensor 10 is perpendicular or horizontal to the ground. Further, as found in comparison between a case of using a single sensor 10 and a case of using the plurality of sensors 10 arranged in parallel with each other, the occurrence of displacement of the object 60 containing iron (Fe) can be normally and continuously measured regardless of the non-polarity part of the object 60 containing iron (Fe).

According to the above-described configuration, a fine change in magnetic field and flux quantity of the object 60 containing iron can be detected such that a position, displacement, or the like of the object 60 containing iron can be detected with ultra-low electric power. In addition, even when the non-polarity range as a range in which a magnetic field of the object 60 subsides is formed as described above, the magnetic field of the object 60 containing iron can be detected by another adjacent sensor 10 or coil 200 such that the sensor module can be normally and continuously operated.

Further, as described above, an additional effect of an installation direction or the like of the sensor 10 with respect to the ground is minimized such that detection and measurement can be performed, regardless of the arrangement of the sensor modules. In addition, when the multi-measurement apparatus of the present invention is formed by arranging the plurality of sensor modules, information of the movement path, the movement speed, the magnetic flux density, or the like of the object containing iron can be determined to be used.

Further, since the multi-measurement apparatus of the present invention can detect a fine change in magnetic field and flux quantity of the object containing iron, the multi-measurement apparatus can exhibit the same performance regardless of an effect of air, soil, water, or the like.

The description of the present invention described above is provided as an example, and a person of ordinary skill in the art to which the present invention pertains can understand that it is possible to easily modify the present invention to another embodiment without changing the technical idea or an essential feature of the present invention. Therefore, the embodiments described above need to be understood as exemplified embodiments in every aspect and not as limiting embodiments. For example, the configurational elements described in singular forms can be realized in a distributed manner. Similarly, the configurational elements described in a distributed manner may be realized in a combined manner.

The scope of the present invention needs to be construed by the claims below, and the meaning and the scope of the claims and every modified or altered embodiment derived from an equivalent concept of the claims need to be construed to belong to the scope of the present invention.

REFERENCE SIGNS LIST

1: First Sensor Module
2: Second Sensor Module
3: Third Sensor Module
10: Sensor
11: 1-1st Sensor
12: 2-2nd Sensor
13: 3-1st Sensor
14: 3-2nd Sensor
20: Impedance Matching Unit
30: Amplifier
41: First Control Unit
42: Second Control Unit
50: Output Unit
60: Object
61: First Object
62: Second Object
63: Third Object
64: Fourth Object
65: Fifth Object
100: Core
111: 1-1st Core
112: 1-2nd Core
121: 2-1st Core
122: 2-2nd Core
131: 3-1st Core
132: 3-2nd Core
200: Coil
211: 1-1st Coil
212: 1-2nd Coil
221: 2-1st Coil
222: 2-2nd Coil
231: 3-1st Coil
232: 3-2nd Coil
300: Housing

The invention claimed is:

1. A multi-measurement apparatus using a search-coil type sensor, the multi-measurement apparatus comprising:
    sensor modules, each having one or more sensors,
    wherein each of the one or more sensors includes housing having an inner space, a core disposed in the inner space of the housing, a coil wound around a portion of an outer circumferential surface of the housing, the portion corresponding to a position of the core;
    impedance matches, each being connected to each of the sensor modules, the impedance matchers being configured to perform impedance matching; and
    amplifiers, each being connected to each of the impedance matchers, the amplifiers being configured to amplify a fine current and voltage generated due to objects containing iron (Fe) approaching to the sensor modules,
    wherein the sensor modules are configured to have respective induced magnetic fields due to a change in distance from the objects,
    wherein the sensor modules are configured to measure movement of one or more of the objects, and
    wherein one end of a coil disposed in one sensor of the one or more sensors is connected to one end of a coil disposed in another sensor of the one or more sensors, and another end of the coil disposed in the one sensor is connected to another end of the coil disposed in the another sensor.

2. The multi-measurement apparatus of claim 1,
    wherein the sensor modules are formed, and the impedance matchers and the amplifiers are connected to the sensor modules, respectively.

3. The multi-measurement apparatus of claim 2, further comprising:
    a first control circuit connected to the amplifiers, the first control circuit being configured to analyze a waveform of the amplified current and voltage; and
    a second control circuit connected to the first control circuit, the second control circuit being configured to analyze the movement of the objects.

4. The multi-measurement apparatus of claim 3,
    wherein the second control circuit is configured to identify at least one object that has a magnetic flux density that is within a predetermined magnetic flux density range among the objects.

5. The multi-measurement apparatus of claim 3, further comprising:
    an output display connected to the second control circuit, the output display being configured to visually output locational changes of the objects.

6. The multi-measurement apparatus of claim 1,
    wherein each of the sensor modules includes a plurality of sensors that are arranged in parallel or radially with each other.

7. The multi-measurement apparatus of claim 1,
    wherein the coils disposed in the one or more sensors are arranged in series with each other.

* * * * *